(12) United States Patent
Masini et al.

(10) Patent No.: US 6,346,852 B1
(45) Date of Patent: Feb. 12, 2002

(54) CLASS-D AMPLIFIER WITH ENHANCED BANDWIDTH

(75) Inventors: Marco Masini, Milan; Luigi Franchini, Rimini; Eric Labbe, Cornaredo, all of (IT)

(73) Assignee: STMicroeletronics S.r.l., Agrate Brianza (IT)

( * ) Notice: Subject to any disclaimer, the term of this patent is extended or adjusted under 35 U.S.C. 154(b) by 0 days.

(21) Appl. No.: 09/557,364

(22) Filed: Apr. 25, 2000

(30) Foreign Application Priority Data

Apr. 27, 1999 (EP) .............................................. 99830247

(51) Int. Cl.[7] ................................................. H03F 3/38
(52) U.S. Cl. ...................................... 330/10; 330/207 A
(58) Field of Search ............................... 330/10, 207 A, 330/251

(56) References Cited

U.S. PATENT DOCUMENTS

| | | | |
|---|---|---|---|
| 4,458,208 A | | 7/1984 | Abe ............................. 330/10 |
| 4,649,565 A | | 3/1987 | Kaizer et al. .................. 381/90 |
| 5,672,998 A | * | 9/1997 | Wittlinger ..................... 330/10 |
| 5,805,020 A | * | 9/1998 | Danz et al. .................... 330/10 |
| 6,016,075 A | * | 1/2000 | Hamo .......................... 330/10 |

* cited by examiner

*Primary Examiner*—Robert Pascal
*Assistant Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A class D amplifier includes an input integrating stage and a modulating stage for modulating the integrated input signal output by the integrating stage. The modulating stage uses as a carrier an alternate waveform of a frequency sufficiently higher than the frequency band of the analog input signal. The modulating stage further outputs a digital signal switching between a positive voltage and a negative voltage, and whose average value represents an amplified replica of the input analog signal. The class D amplifier further includes an output power stage producing an output digital signal. A feedback line including a resistor is connected between the output of the output power stage and an input node of an operational amplifier. The class D amplifier also includes a low-pass filter reconstructing an output analog signal, and a delay stage. The delay stage is functionally coupled in the direct path of propagation of the digital signal from the output of the modulating stage to an input of the output power stage. The delay stage delays the digital signal from the output of the modulating stage by a delay. The value of the delay is defined as a function of a desired broadening of the bandwidth and in consideration of the corresponding restriction of the range of variation of the duty cycle of the output digital signal.

27 Claims, 8 Drawing Sheets

CLASS-D AMPLIFIER WITH ENHANCED BANDWIDTH

FIELD OF THE INVENTION

The present invention relates to electronic circuits, and, more particularly, to class D pulse width modulation (PWM) amplifiers.

BACKGROUND OF THE INVENTION

FIG. 1 shows the typical scheme of a class D amplifier. This type of amplifier is a well-known PWM system (see K. Nielsen, "Review and Comparison of PWM methods for analog and digital input switching power amplifiers," AES Mar. 22–25, 1997).

The operation of the amplifier is depicted in FIG. 2. The input signal (Vin) is compared with a waveform, most often triangular (Vtr) and having a relatively high frequency fsw much higher than the frequency band limit of the amplifier. The output (Vout) is a PWM signal switching between a positive voltage (Vcc) and a negative voltage (-Vcc). The average value (Vo) of the output digital signal represents an amplified replica of the analog input signal and may be easily calculated with the following equations:

$$Vo = G \cdot Vin \quad (1)$$

$$G = \frac{Vcc}{Vtr} \quad (2)$$

where Vtr is the peak value of the reference (triangular) wave and G is the voltage gain of the amplifier.

The relationship between Vo and Vin is thereby theoretically linear. In practice though this is not true because the non-idealities of the triangular wave and the output buffer stage may produce an unacceptable amount of distortion on the output signal. Therefore, a feedback loop capable of compensating the non-idealities of the system is desired.

A typical feedback circuit is shown in FIG. 3. Given that the average charge of the integrating capacitor C must be null during a switching period (Tsw=1/fsw), it may be assumed that the average current on the feedback resistor R2 during a switching period is equal to the current on the input resistor R1, therefore:

$$Vo = G_c \cdot Vin \quad (3)$$

$$G_c = 1 + \frac{R_2}{R_1} \quad (4)$$

where Gc is the closed loop gain of the system.

The open loop gain Cloop of the system may be easily calculated by analyzing the scheme of FIG. 4, wherein a linearized system is considered with the Vin node short-circuited to ground and the PWM stage substituted with a linear block with a gain Vcc/Vtr (see equation 2).

The input resistor R1 has been neglected because, at the frequencies of interest, the negative input of the integrator represents a virtual ground (because the integrating capacitor C provides an extremely low impedance) and therefore there is not any significative voltage drop on the input resistor R1.

The open loop gain Gloop and the unity gain frequency are thus respectively defined by:

$$G_1(s) = \frac{Vcc}{Vtr} \cdot \frac{1}{s \cdot R2 \cdot C} \quad (5)$$

$$f_0 = \frac{1}{2\pi} \cdot \frac{Vcc}{Vtr} \cdot \frac{1}{R2 \cdot C} \quad (6)$$

This system has a stability limit that limits the system's bandwidth This limit may be calculated (referring to FIG. 3) by considering that for a correct functioning of the system, the slope of the ripple signal (Vr) must be lower than the slope of the triangular wave (Vtr). If this condition is not met, the system may produce repeated output switchings at intervals equal to the delay of the chain delay defined by the PWM stage and by the output buffer stage.

Correct and critical functioning conditions are schematically depicted in the diagrams of FIG. 5. By converting this concept into formulas:

$$P_t = 4 \cdot Vtr \cdot fsw \text{ (slope of triangular waveform)} \quad (7)$$

$$p_2 = \frac{1}{C} \cdot \left( \pm \frac{Vcc}{R2} - \frac{Vin}{R1} \right) \text{ (slope of the ripple)} \quad (8)$$

To obtain the limit condition the maximum slope of the ripple signal should be considered, that is, the maximum input signal $Vin_{max}$. From equations (3), (4):

$$Vin_{max} = \frac{Vcc}{Gt} \quad (9)$$

Therefore, the maximum p2 value is given by:

$$p_{2,max} = \frac{1}{C} \cdot \left( \frac{Vcc}{R2} + \frac{Vcc}{R1 \cdot Gt} \right) = \frac{Vcc}{C} \cdot \left( \frac{1}{R2} + \frac{1}{R1 + R2} \right) = \frac{Vcc}{R2 \cdot C} \cdot \left( 1 + \frac{R2}{R1 + R2} \right) \quad (10)$$

Therefore, the limit condition is:

$$p_{2,max} = \frac{Vcc}{R2 \cdot C} \cdot \left( 1 + \frac{R2}{R1 + R2} \right) \leq 4 \cdot Vtr \cdot fsw = p_t \quad (11)$$

Considering equation (6), this condition may be rewritten as:

$$f_0 \leq \frac{2}{\pi} \cdot \frac{1}{\left( 1 + \frac{R2}{R1 + R2} \right)} \cdot fsw \quad (12)$$

which represents a bandwidth limit. It should be noticed that for a Ggain>10 (that is for R2/R1>10), equation (12) may be simplified into the following equation:

$$f_0 < \frac{fsw}{\pi} \quad (13)$$

SUMMARY OF THE INVENTION

Confronted with these limitations and drawbacks of known amplifiers, a manner has now been found to overcome this limiting critical condition and allow for an extended bandwidth at the expense of a negligible reduction of the range of variation of the duty cycle of the digital output signal.

The amplifier of the present invention functions even when the slope of the triangular wave is lower than the slope of the ripple of the input signal without causing spurious repetitive switchings of the output signal.

This important result is obtained by introducing a certain delay on the direct signal path, downstream of the PWM output stage, and in any case before the output node from which the feedback signal is derived for compensating the non-idealities of the system.

BRIEF DESCRIPTION OF THE DRAWINGS

The various aspects and effects of the invention are described in more detail in the following description of an embodiment and with reference to the attached drawings.

DETAILED DESCRIPTION OF THE PREFERRED EMBODIMENTS

Figure 1:
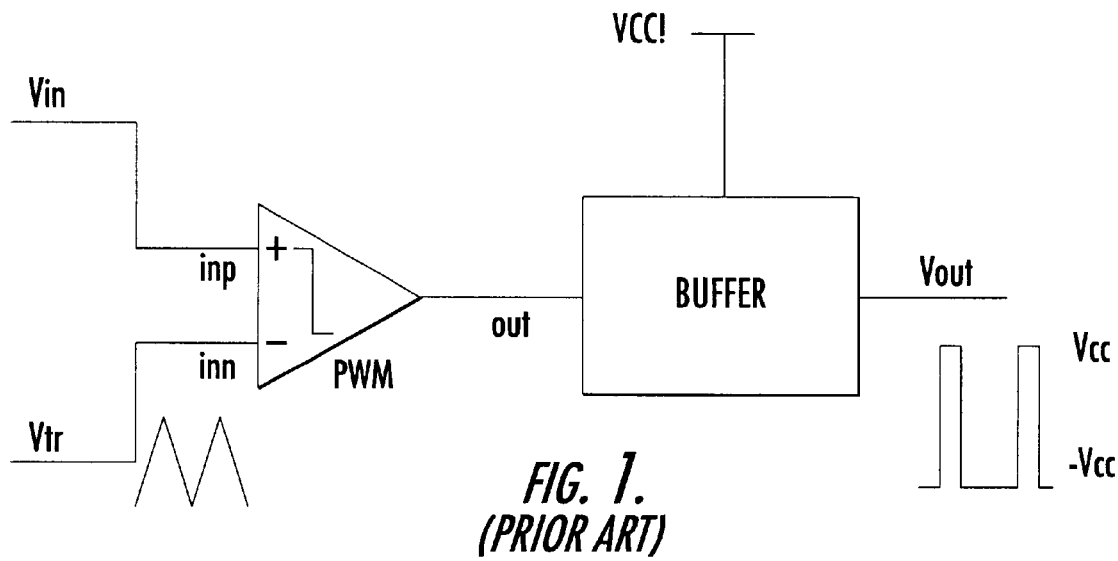
FIG. 1 shows the basic scheme of a class D amplifier as in the prior art
Figure 2:
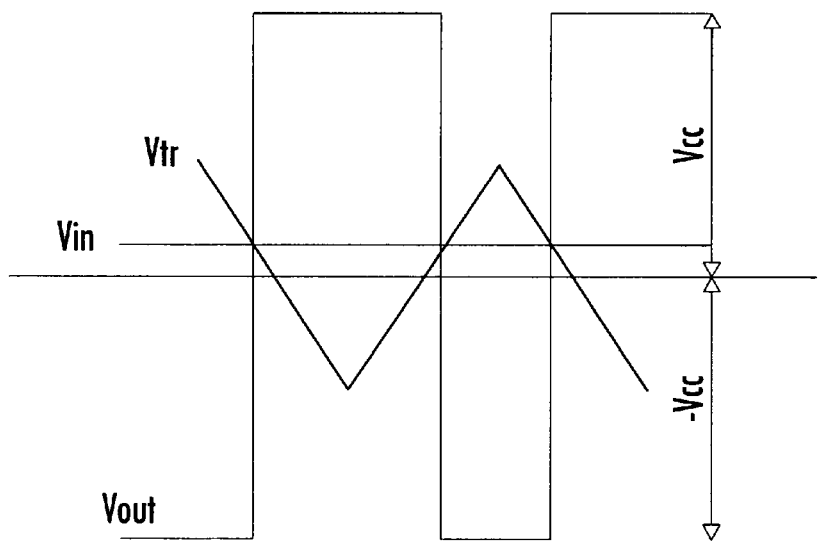
FIG. 2 shows the characteristic waveforms of a PWM amplifier as in the prior art.
Figure 3:
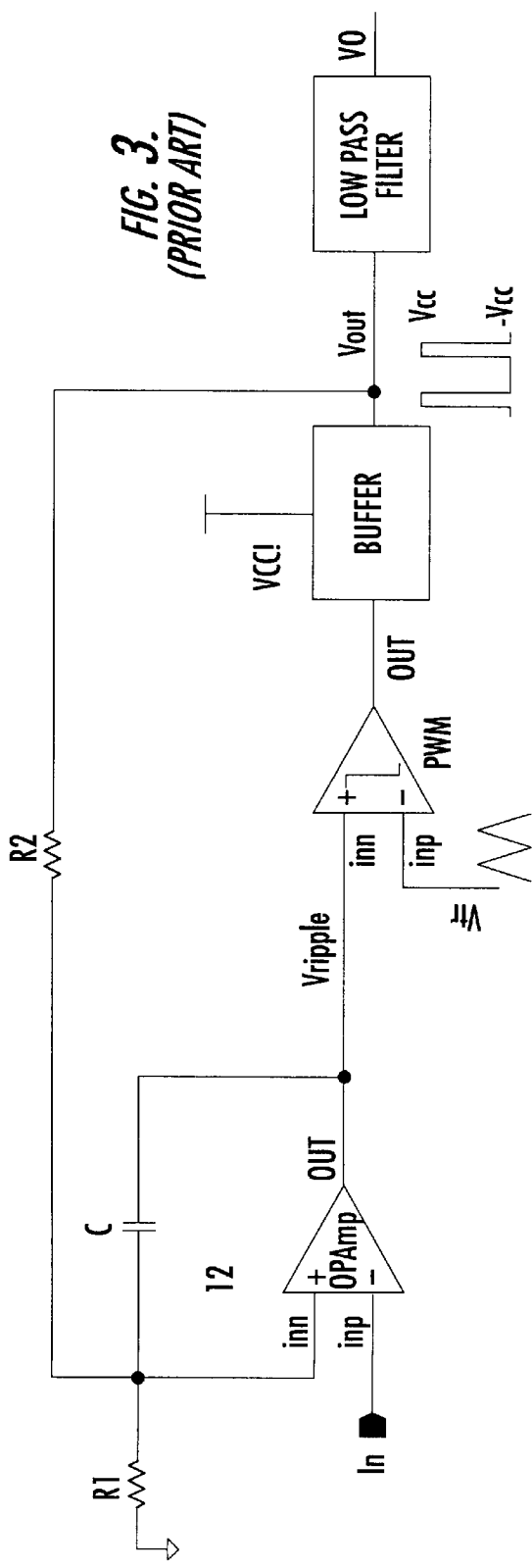
FIG. 3 is a functional block diagram of a class D amplifier as in the prior art.
Figure 4:
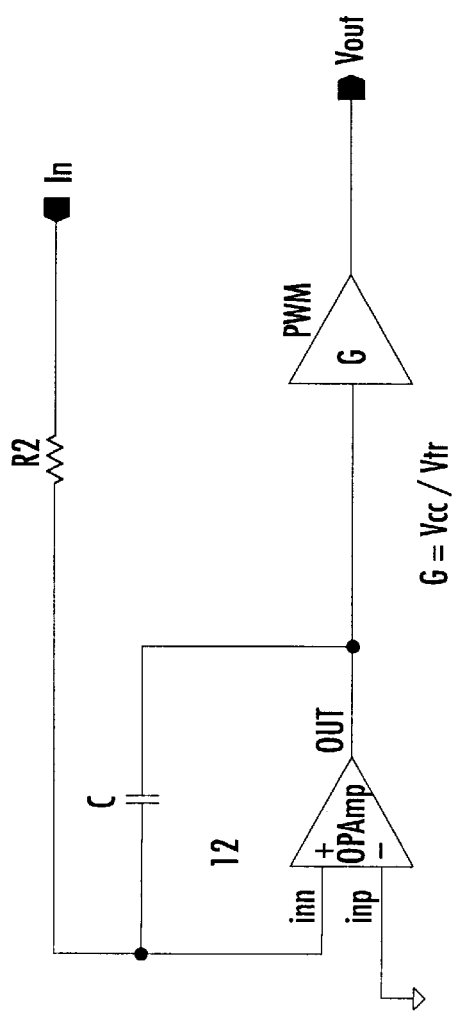
FIG. 4 is a simplified open loop analysis model of the amplifier of FIG. 3.
Figure 5:
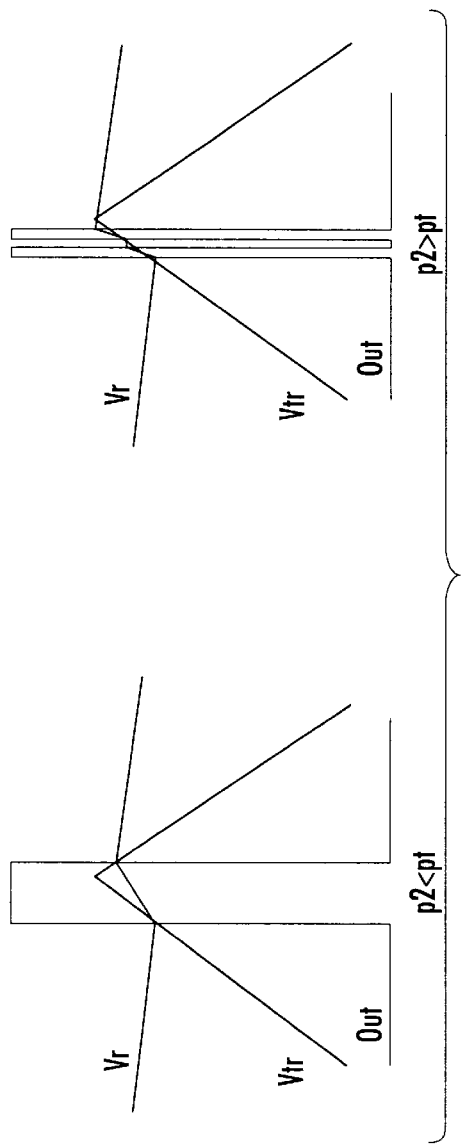
FIG. 5 shows diagrams illustrative of the stability limit of an amplifier as in the prior art.
Figure 6:
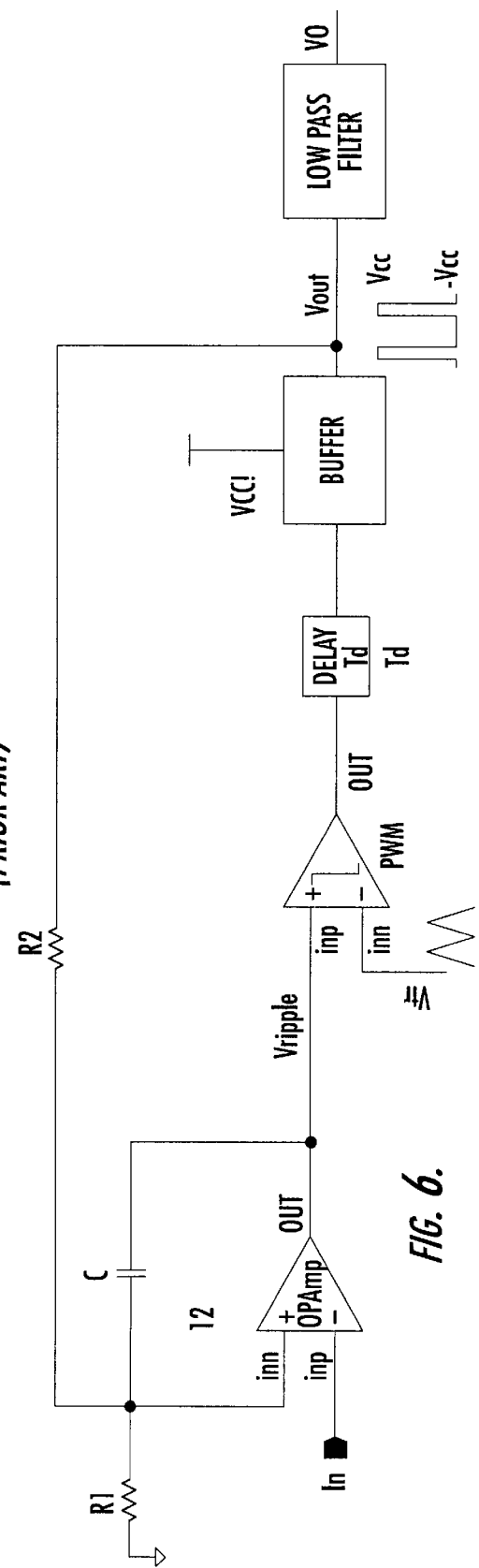
FIG. 6 is a functional block diagram of a class D amplifier according to the present invention.

The functional diagram of a class D amplifier according to the present invention is shown in FIG. 6. By way of comparison with the diagram of FIG. 3 of an amplifier realized according to known techniques, the element that is introduced is the block DELAY Td, coupled in the direct signal path, in cascade to the output of the comparator PWM and, preferably, before the output power stage BUFFER.

Figure 7:
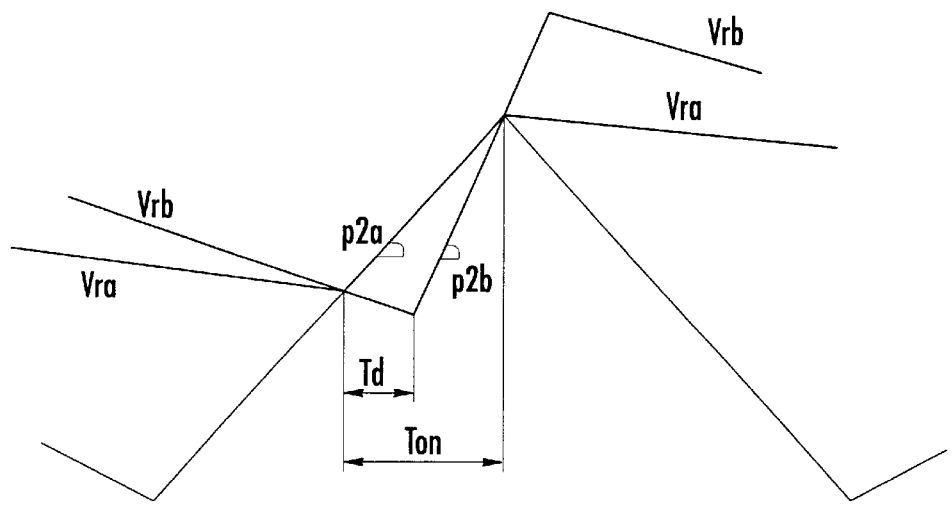
FIG. 7 is a diagram illustrating the effect of the delay introduced according to the present invention.

The functioning with and without the introduction of the delay Td is shown in FIG. 7. It may be immediately concluded that the introduction of the delay Td permits the system to function satisfactorily even with a larger slope of the ripple (p2b) than the slope of the triangular wave, without causing spurious switchings of the output.

For an accurate calculation of the improvement of the bandwidth limit when using the delay block of the invention, it should be considered that the introduction of the delay changes the PWM stage gain (the larger the introduced delay, the lower the gain). Moreover, differently from what occurs in a known system, the most critical condition for the stability of a system with a delay block, according to the present invention, coincides with that of an average duty cycle and not with that of maximum or minimum duty cycle, as was the case in a known system.

Bandwidth Calculation

The starting hypothesis is the following. The PWM modulator may be considered, for bandwidth calculation, as a linear block with a voltage gain given by the ratio between the average of the output signal and the average of the ripple signal.

The calculation entails three steps:
1. expressing the PWM modulator gain as a function of the delay;
2. defining the stability conditions; and
3. calculating the maximum bandwidth allowed.

Figure 8:
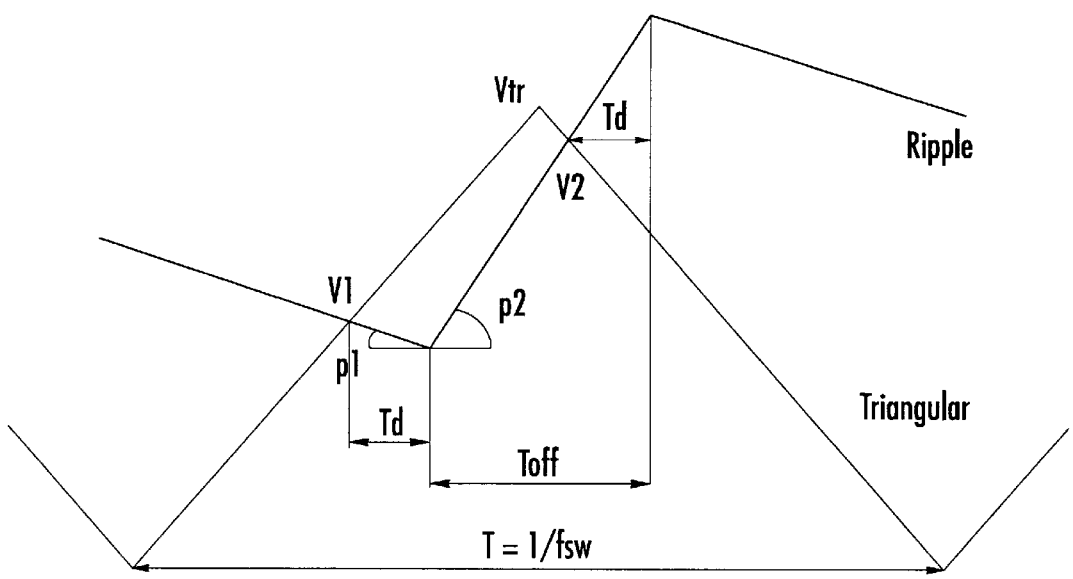
FIG. 8 is a scheme of the functioning conditions of the amplifier of the invention.

FIG. 8 indicates the parameter notation adopted for the analysis and calculation.

1) Gain of the PWM Modulator

The following equations among the parameters involved are readily verified:

$$p1=p\cdot(1-d) \quad p2=pd \quad pt=4Vtr\cdot fsw \quad Toff=(1-d)/fsw \quad p=2Vcc/\tau$$

where d is the duty cycle, 2*p is the slope of the ripple for d=0.5, pt is the slope of the triangular wave, Vtr is the peak voltage of the triangular wave, fsw is the switching frequency and τ is the time constant of the system (τR2·C, see FIG. 6).

By using these equations, it is useful to express the voltages V1 and V2 of FIG. 8 with geometrical considerations and thereby the average voltage of the ripple signal. The result is that the voltage gain of the PWM modulator, as defined in the starting hypothesis, is given by:

$$G_{PWM} + G_0 \cdot \frac{1}{1+G_0 \cdot (Td/\tau)} \quad (14)$$

where G0 is the gain in absence of delay (G0=Vcc/Vtr) and Td is the delay. Therefore, the delay reduces the gain of the PWM modulator.

2) Stability Conditions

It is useful to introduce a new parameter defined by:

$$\alpha = \frac{p}{p_t}$$

Therefore, 2*α represents the ratio of the calculated slope of the ripple with d=0.5 and the slope of the triangular wave. Thus, the problem is to establish the maximum admissible value of the parameter a without generating stability problems.

With reference to FIG. 8, the stability condition is given of course by the equality V2=Vtr. Upon imposing this condition, in order to guarantee the stability throughout the whole range of variation of the duty cycle field, the ratio α must be less than the limit value αmax., whose value is shown in the diagram of FIG. 8. For example, with a delay of 200 ns, a system with an α factor of about 1.6 may be implemented without any stability problems.

3) Maximum Allowed Bandwidth

From the starting hypothesis on the PWM modulator gain, it follows that the bandwidth of the system (that is the unity open loop gain frequency) is given by:

$$f_0 = \frac{G_{PWM}}{2\Pi \cdot \tau} \quad (15)$$

Using the equation (14), the equation (15) may be rewritten as a function of the α parameter:

$$f_0 = \frac{f_{SW}}{\Pi} \cdot \frac{\alpha}{1 + (2 \cdot td \cdot fsw) \cdot \alpha} \quad (16)$$

Since fsw/p represents the maximum bandwidth with Td=0, an expression of the bandwidth improvement (β factor) due to the delay introduced may be expressed as:

$$\beta = \frac{f_0 \cdot \Pi}{fsw} = \frac{\alpha}{1 + (2 \cdot Td \cdot fsw) \cdot \alpha} \quad (17)$$

Figure 9:
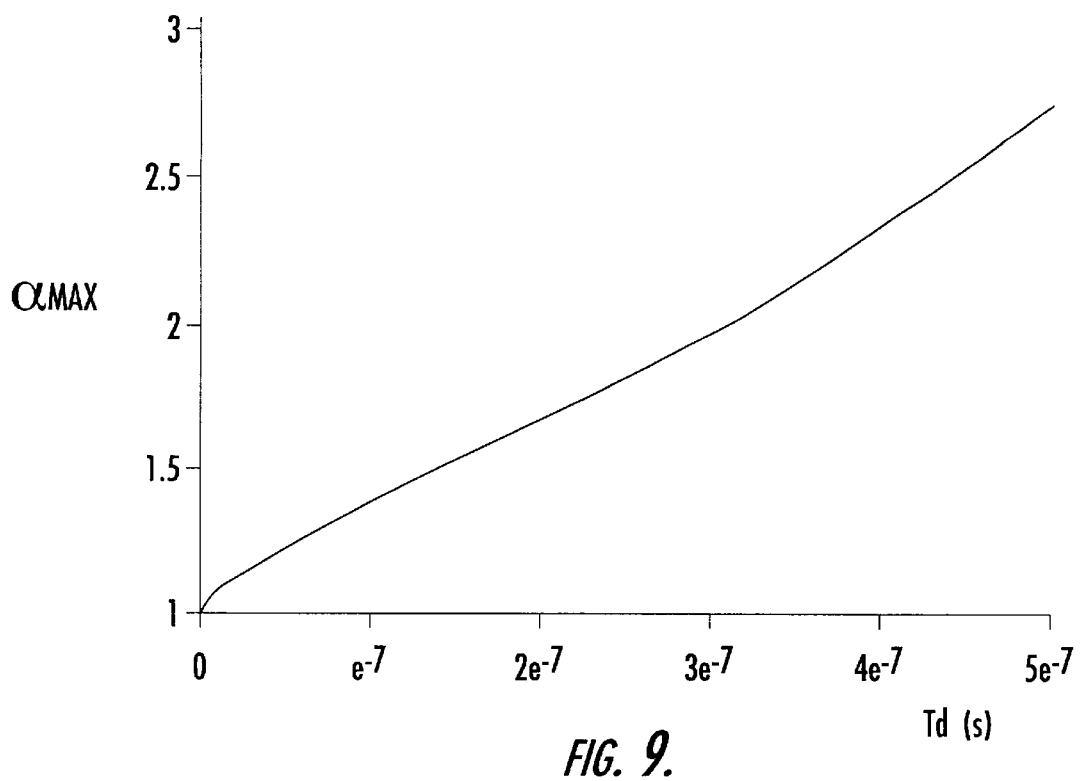
FIG. 9 shows the maximum allowable ratio between the slope of the ripple and the slope of the triangular waveform without causing instability problems.

By introducing the equation (17) the maximum value of the α factor for a certain delay Td (see FIG. 9), the maximum bandwidth increment of the bandwidth (βmax.) for the considered delay Td may be calculated.

Figure 10:
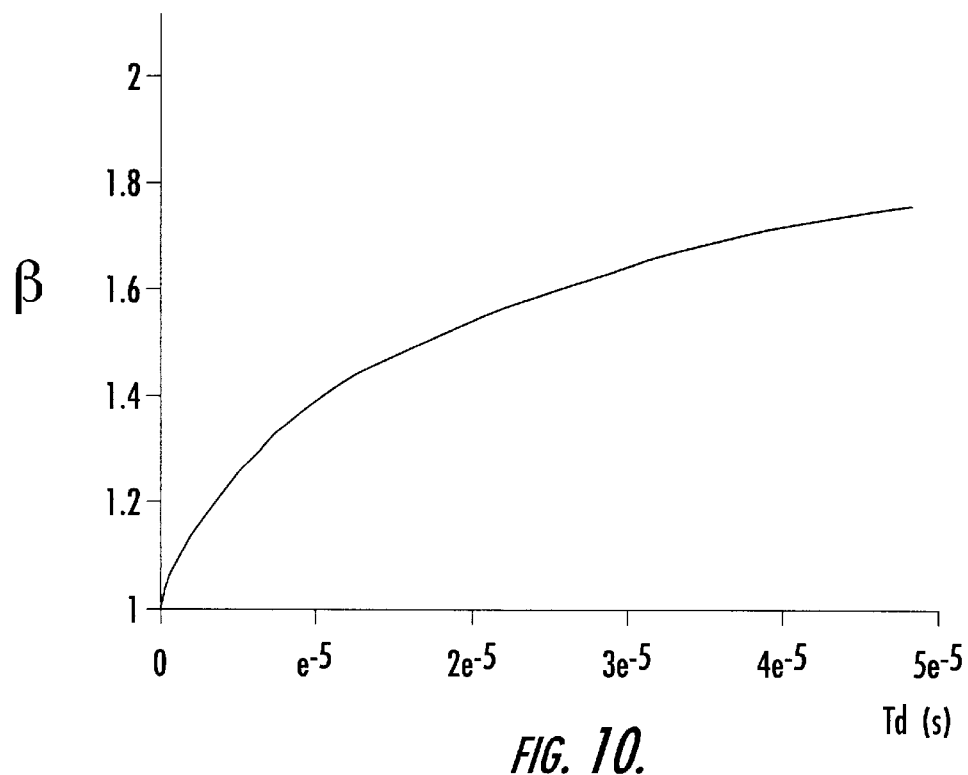
FIG. 10 shows the characteristic of bandwidth increment as a function of the introduced delay.

FIG. 10 shows the bandwidth improvement factor β as a function of the delay (for a switching frequency fsw=200 KHz). For example, with a delay of 300 ns the improvement is about 60%. In any case, the maximum usable delay is upper limited by the maximum duty cycle at a certain switching frequency Indeed, in order to obtain for example a duty cycle of 90% at a switching frequency of 200 KHz, the introduced delay should not be larger than 500 ns, that is to say not greater than Toff=(i–d)/fsw. Beyond this limit, the system would start to skip cycles, reproducing "too high" duty cycle situation. Hence, it may be useful to express the bandwidth increment as a function of the maximum allowed duty cycle. This relation is shown in FIG. 11.

Figure 11:
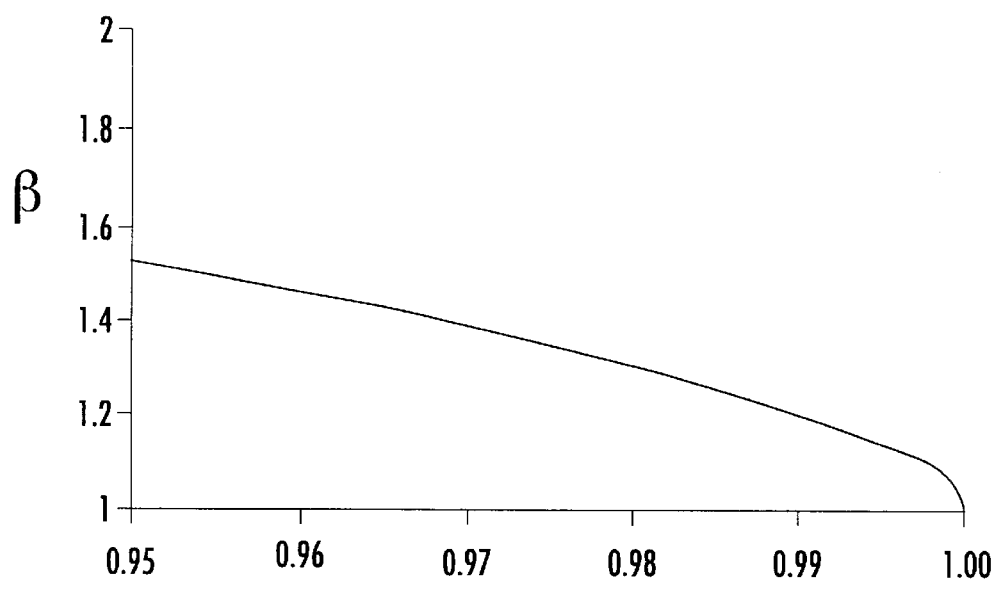
FIG. 11 shows the characteristic of bandwidth increment as a function of the maximum duty cycle.

With reference to the characteristics of FIG. 11, for example, for a delay Td=250 ns at a switching frequency fsw=200 KHz, the duty cycle may range between 5% and 95% without skipping phenomena and with a bandwidth improvement factor of 1.5 referred to an amplifier made according to the prior art.

Example of an Embodiment

In practice, it is desired to realize a circuit that reproduces at an output a delayed replica of the PWM input signal. Given that the delay Td to be introduced may be larger than the minimum time Ton (or Toff) of a phase of the PWM input signal, it is necessary to use two independent voltage ramps, respectively starting with the rising edge and with the falling edge of the digital input signal.

Figure 12:
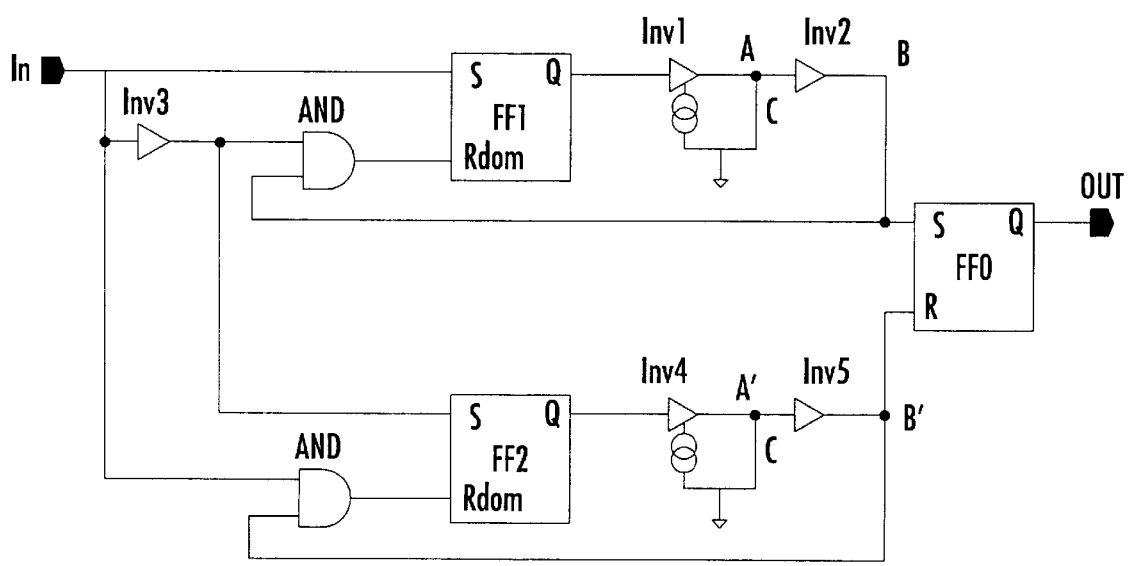
FIG. 12 shows a possible embodiment of the delay circuit.

FIG. 12 shows a possible circuit diagram of the delay block that is introduced in the direct signal path of the PWM signal in an amplifier realized according to the present invention By referring to the scheme of FIG. 12, on the nodes A and A' there exist respectively the ramp starting with the rising edge of the input signal and the ramp starting with the falling edge of the input signal. The slope of the voltage ramps is given by –I/C, where I is the discharge current of the capacitor C.

Figure 13:
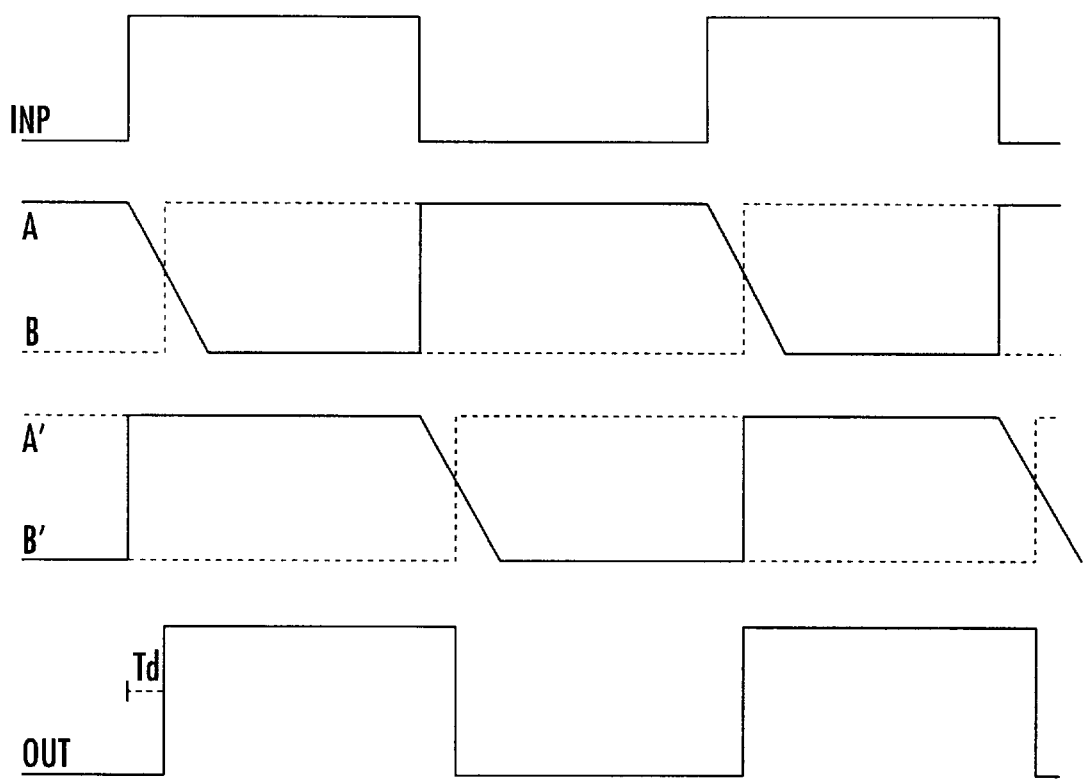
FIG. 13 shows the waveforms of the delay circuit for a duty cycle of 50%.

In order to better comprehend the functioning of the circuit, reference may be made to the waveforms of FIG. 13, which illustrate a whole switching period with an input signal with a duty cycle of 50%. When the input signal goes high, the FF1 flip-flop is set and the capacitor C is discharged at a constant current I. The voltage on the node A starts to decrease with a constant slope I/C. When the voltage on the node A reaches the threshold Vth of the inverter, the voltage on the node B switches high and the $FF_0$ input flip-flop is set.

By way of simplicity, the inverters are symmetrical (that is Vth=Vs/2, being Vs the supply voltage), therefore the delay is given by:

$$Td = \frac{V_sC}{2I}$$

Under these conditions, with the node B in a logic high state, the reset of the flip-flop FF1 takes place when the input signal goes low. The reset of FF1 determines the reset of the voltage ramp (the node A switching to a high logic state). The lower branch of the circuit will function in a similar fashion, starting from a falling edge of the input signal.

Figure 14:
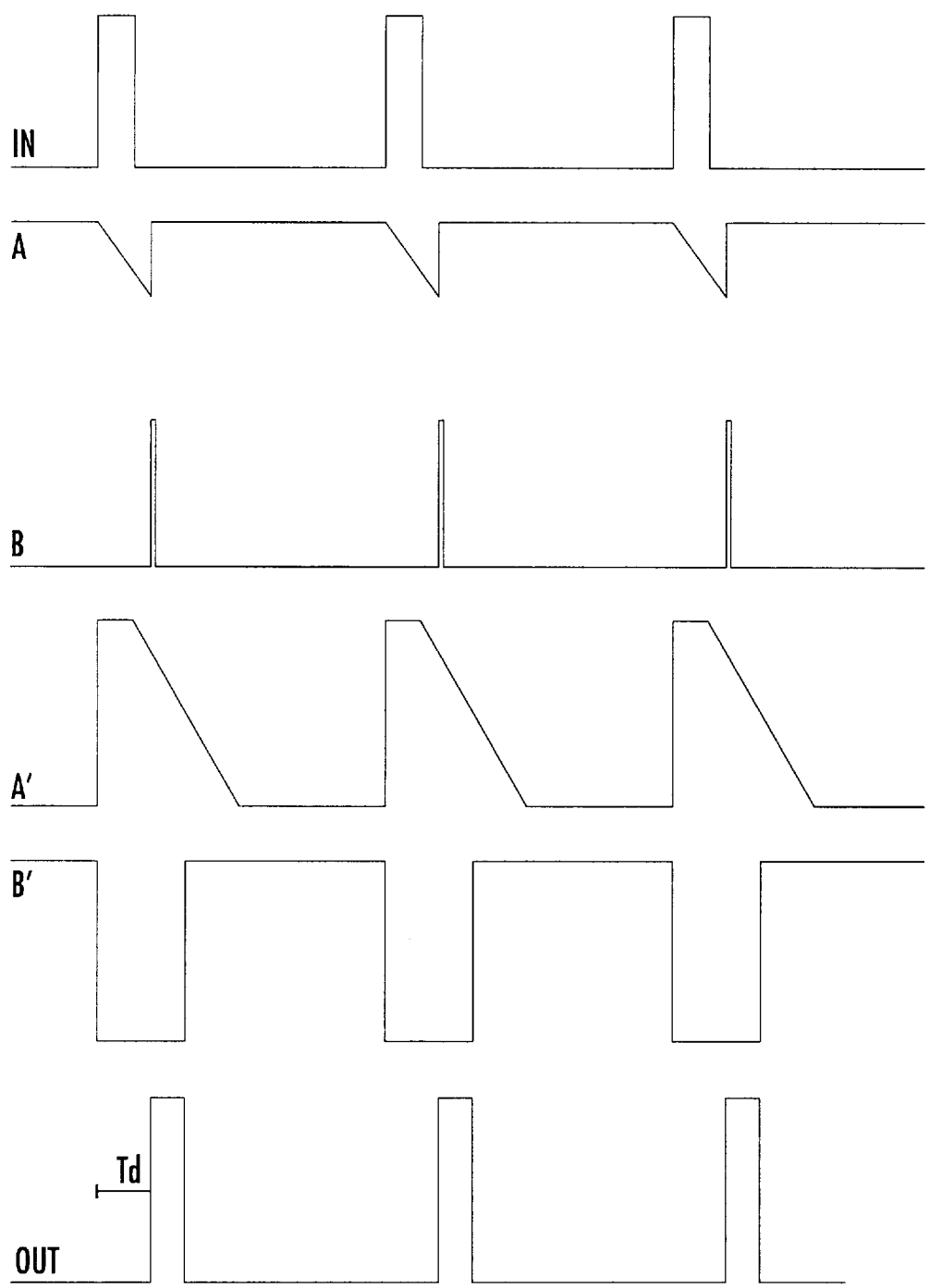
FIG. 14 shows the waveforms for a duty cycle close to its maximum limit.

FIG. 14 illustrates a condition when the duration of the high input phases Ton is shorter than the delay Td. It may be observed that in this case, the reset of the FF1 flip-flop follows directly the rising edge of the voltage on the node B. Therefore the duration of the set pulse of the output flip-flop $FF_0$ is determined solely by the delay of the flip-flop FF1 and of the pair of inverters.

That which is claimed is:

1. A class D amplifier comprising:
   an input integrating stage comprising an operational amplifier receiving an analog input signal having a frequency band and providing an integrated input signal;
   a feedback line comprising a resistor connected to said operational amplifier;
   a modulating stage receiving the integrated input signal and an alternating waveform of a frequency higher than the frequency band of the analog input signal, said modulating stage outputting a digital signal switching between a positive voltage and a negative voltage, the digital signal having an average value representing an amplified replica of the analog input signal;
   an output power stage providing an output digital signal having a duty cycle to said feedback line;
   a low-pass filter receiving the output digital signal and reconstructing an output analog signal; and
   a delay stage functionally coupled in the direct path of propagation of the digital signal from said modulation stage to said output power stage to delay the digital signal by a delay to prevent a further crossing between the integrated input signal and the alternating waveform after a first crossing has occurred and before the alternating waveform passes through a minimum or through a maximum.

2. The class D amplifier of claim 1 wherein said delay stage comprises first and second propagation paths of the digital signal and a bistable output circuit having set and reset inputs respectively connected to said first and second propagation paths.

3. The class D amplifier of claim 2 wherein said first propagation path comprises:
   a first bistable circuit set by the digital signal;
   a first inverter driven by said first bistable circuit;
   a first capacitor charged by said first inverter that discharges at a constant current and provides a first charge ramp;
   a second inverter driven by the first charge ramp and providing an output to the set input of said bistable output circuit;

a third inverter receiving the digital signal and providing an inverted digital signal; and a first logic AND gate receiving the output of said second inverter and the inverted digital signal and providing a reset signal to the first bistable circuit.

4. The class D amplifier of claim 3 wherein said second propagation path comprises:

a second bistable circuit set by the inverted digital signal;

a fourth inverter driven by the output of said second bistable circuit;

a second capacitor driven by said fourth inverter that charges at a constant current and provides a second charge ramp;

a fifth inverter driven by the second charge ramp and providing an output to the reset input of said bistable output circuit; and a second logic AND gate receiving the output of said fifth inverter and the digital signal and providing a reset signal to said second bistable circuit.

5. The class D amplifier of claim 1 wherein said operational amplifier has a first input receiving the output digital signal from said feedback line, a second input receiving the analog input signal, and an output providing the integrated input signal; and wherein said input integrating stage further comprises a resistor connected between said first input and a power ground and an integrating capacitor connected between said first input and said output.

6. The class D amplifier of claim 1 wherein said modulating stage has a gain, and wherein the gain decreases as the delay is increased.

7. The class D amplifier of claim 1 wherein the delay coincides with an average duty cycle of the output digital signal.

8. A class D amplifier comprising:

an input integrating stage receiving an analog input signal and providing an integrated input signal;

a modulating stage receiving the integrated input signal and an alternating waveform, and providing a digital signal switching between a positive voltage and a negative voltage;

a delay stage receiving the digital signal and delaying the digital signal by a delay to prevent a further crossing between the integrated input signal and the alternating waveform after a first crossing has occurred and before the alternating waveform passes through a minimum or through a maximum;

an output power stage receiving the delayed digital signal from said delay stage; and a feedback line between said output power stage and said input integrating stage.

9. The class D amplifier of claim 8 wherein the output digital signal has a duty cycle; and wherein the delay is defined as a function of a desired broadening of the bandwidth of the class D amplifier and based on a range of variation of the duty cycle of the output digital signal.

10. The class D amplifier of claim 8 wherein said input integrating stage further comprises an operational amplifier having first and second inputs and an output, a resistor connected between said first input and a power ground, and a capacitor connected between said first input and said output; and wherein said second input receives the analog input signal.

11. The class D amplifier of claim 8 wherein the analog input signal has a frequency band; and wherein the alternating waveform has a higher frequency than the frequency band of the analog input signal.

12. The class D amplifier of claim 8 wherein the digital signal has an average value representing an amplified replica of the analog input signal.

13. The class D amplifier of claim 8 further comprising a low-pass filter receiving the output digital signal and reconstructing an output analog signal.

14. The class D amplifier of claim 8 wherein said delay stage is coupled in the path of propagation of the digital signal from said modulating stage to said output power stage.

15. The class D amplifier of claim 8 wherein said delay stage further comprises first and second propagation paths of the digital signal and a bistable output circuit having set and reset inputs respectively connected to said first and second propagation paths.

16. The class D amplifier of claim 15 wherein said first propagation path comprises:

a first bistable circuit set by the digital signal;

a first inverter driven by said first bistable circuit;

a first capacitor charged by said first inverter that discharges at a constant current and provides a first charge ramp;

a second inverter driven by the first charge ramp and providing an output to the set input of said bistable output circuit;

a third inverter receiving the digital signal and providing an inverted digital signal; and a first logic AND gate receiving the output of said second inverter and the inverted digital signal and providing a reset signal to the first bistable circuit.

17. The class D amplifier of claim 16 wherein said second propagation path comprises:

a second bistable circuit set by the inverted digital signal;

a fourth inverter driven by the output of said second bistable circuit;

a second capacitor driven by said fourth inverter that charges at a constant current and provides a second charge ramp;

a fifth inverter driven by the second charge ramp and providing an output to the reset input of said bistable output circuit; and a second logic AND gate receiving the output of said fifth inverter and the digital signal and providing a reset signal to said second bistable circuit.

18. The class D amplifier of claim 8 wherein the modulating stage has a gain, and wherein the gain of the modulating stage decreases as the delay is increased.

19. The class D amplifier of claim 8 wherein the output digital signal has a duty cycle; and wherein the delay coincides with the average duty cycle of the output digital signal.

20. A method for enhancing bandwidth in a Class D amplifier comprising:

coupling an analog input signal to an input integrating stage of the Class D amplifier and providing an integrated input signal using the input integrating stage;

modulating the integrated input signal and an alternating waveform using a modulating stage of the Class D amplifier to provide a digital signal switching between a positive voltage and a negative voltage;

delaying the digital signal by a delay to prevent a further crossing between the integrated input, signal and the alternating waveform after a first crossing has occurred and before the alternating waveform passes through a minimum or through a maximum;

using an output power stage of the Class D amplifier to provide an output digital signal from the delayed digital signal; and feeding the output digital signal back from the output power stage to the input integrating stage.

21. The method of claim 20 wherein the output digital signal has a duty cycle; and wherein the delay is defined as a function of a desired broadening of the bandwidth of the amplifier and based upon the range of variation of the duty cycle of the output digital signal.

22. The method of claim 20 wherein the analog input signal has a frequency band; and wherein the alternating waveform has a frequency higher than the frequency band of the analog input signal.

23. The method of claim 20 wherein the digital signal has an average value representing an amplified replica of the analog input signal.

24. The method of claim 20 wherein the delay is provided in the path of propagation of the digital signal from the modulating stage to the output power stage.

25. The method of claim 20 wherein the delaying is provided by a delay stage comprising first and second propagation paths of the digital signal and a bistable output circuit having set and reset inputs respectively connected to the first and second propagation paths.

26. The method of claim 20 wherein the modulating stage has a gain, and wherein the gain of the modulating stage decreases as the delay is increased.

27. The method of claim 20 wherein the output digital signal has a duty cycle; and wherein the delay coincides with the average duty cycle of the output digital signal.

* * * * *